(12) United States Patent
Ogawa

(10) Patent No.: US 6,958,969 B2
(45) Date of Patent: Oct. 25, 2005

(54) OPTICAL SEMICONDUCTOR COMPONENT PACKAGE AND OPTICAL PICKUP DEVICE

(75) Inventor: Masaru Ogawa, Ikoma (JP)

(73) Assignee: Sharp Kabushiki Kaisha, Osaka (JP)

( * ) Notice: Subject to any disclaimer, the term of this patent is extended or adjusted under 35 U.S.C. 154(b) by 653 days.

(21) Appl. No.: 10/187,712

(22) Filed: Jul. 1, 2002

(65) Prior Publication Data

US 2003/0015717 A1    Jan. 23, 2003

(30) Foreign Application Priority Data

Jul. 4, 2001    (JP)    ............................. 2001-203529

(51) Int. Cl.[7] ............................................... G11B 7/00
(52) U.S. Cl. .................. 369/121; 369/122; 369/112.01; 369/44.12
(58) Field of Search ............................... 369/121, 122, 369/120, 116, 112.01, 112.27, 112.28, 44.41, 369/44.12, 44.23, 44.14, 53.1

(56) References Cited

U.S. PATENT DOCUMENTS 5,105,403 A * 4/1992 Kando et al. ............ 369/44.12
5,150,343 A * 9/1992 Goto et al. ............... 369/44.22
5,200,940 A * 4/1993 Goto et al. ............... 369/44.15

FOREIGN PATENT DOCUMENTS

| JP | 3035077 | 2/2000 |
|---|---|---|
| JP | 2000-123433 | 4/2000 |

* cited by examiner

Primary Examiner—Muhammad Edun
(74) Attorney, Agent, or Firm—David G. Conlin; Steven M. Jensen; Edwards & Angell, LLP

(57) ABSTRACT

In an optical semiconductor package according to the present invention, the component bearing surface of the stem having an outline made up of opposed first and second circular-arc parts, a first straight-line part which connects each end of the first and second circular-arc parts and a second straight-line part which connects each other end of the first and second circular-arc parts. The first and second circular-arc parts have a common center, and the first circular-arc part has a larger radius than that of the second circular-arc part. Thus, the larger space, the space between the first circular-arc part and the center, can be used for disposing the light detector or a polarization split element, and the unused space, the space between the second circular-arc part and the center, will be minimum, thereby realizing downsizing and cost reduction of the device.

9 Claims, 4 Drawing Sheets

OPTICAL SEMICONDUCTOR COMPONENT PACKAGE AND OPTICAL PICKUP DEVICE

FIELD OF THE INVENTION

The present invention relates to an optical semiconductor component package including a light emitter and a photoreceptor, and an optical pickup device equipped with the optical semiconductor component package.

BACKGROUND OF THE INVENTION

The optical semiconductor component package is included in an optical pickup device which carries out reading and writing for optical discs. The semiconductor package has a light emitter which emits light to an optical disc, a diffraction grating which diffracts reflection light from the optical disc, and a photoreceptor which detects the light diffracted by the diffraction grating, and the like.

As an example of the described semiconductor package, the following will explain the arrangement of a semiconductor laser package disclosed in Japanese Patent Publication No. 3035077 (published on Jan. 14, 1994). FIG. 6 is a plan view of this conventional semiconductor package, and FIG. 7 is a perspective view of the package.

This package includes a semiconductor laser chip 104 for emitting a laser beam, a PIN photodiode 105 for monitoring the laser beam of the semiconductor laser chip 104, and a photodiode 106 for receiving the reflection light from an optical disc, on a component bearing surface of a stem 101. Further, a cap 102 is provided to cover these optical elements and a glass substrate 103 having an optical deflecting diffraction grating is provided in a hole which is formed in the edge of the cap 102. Further, a laser beam emission glass window 107 is formed on the cap 102.

Here, the semiconductor laser chip 104 is disposed in the center of the component bearing surface of a stem 101. Further, the photodiode 106 is disposed on one side of the semiconductor chip by keeping a distance from the semiconductor laser chip 104. The optical deflecting diffraction grating of the glass substrate 103 makes the reflection light from the optical disk incident onto the photodiode by diffracting the reflection light from the optical disk.

Two opposed circular-arc parts 101a and 101b, and two opposed straight-line parts 101c and 101d make up the outline of the component bearing surface of the stem 101. The circular-arc parts 101a and 101b are provided symmetrically with respect to the center of the component bearing surface of the stem 101, where the semiconductor laser chip 104 is provided. With this arrangement, by holding the circular-arc parts 101a and 101b of the stem 101 so that the stem 101 can rotate, it is possible to rotate the stem 101 without shifting an optical axis of the semiconductor laser chip 104.

In the optical pickup device having this semiconductor package, it is possible to accurately read a servo signal of the optical disc, as the stem 101 is rotated by thus holding the circular-arc parts 101a and 101b of the stem 101.

Further, the following will explain the arrangement of another optical pickup device, which is disclosed in Japanese Unexamined Patent Publication No. 2000-123433 (published on Apr. 28, 2000). FIG. 8 is a cross-sectional view of this conventional optical pickup device.

This optical pickup device includes:
a semiconductor laser 201 which emits a laser beam;
a second diffraction grating 216 which divides the laser beam from the semiconductor laser 201 into three or more light beams;
a lens (not shown) which collects the laser beams divided by the second diffraction grating 216 on an optical disc;
a beam splitter 202 which splits reflection light from the optical disc into differently polarized components;
a first diffraction element 206 which diffracts a part of the reflection light split by the beam splitter 202; and
a photoreceptor 207 which receives the reflection light which is split by the beam splitter 202 and partly diffracted by the first diffraction element 206.

One of the three beams divided by the second diffraction grating 216 is used as a main-beam for reading out data from the optical disk and writing data on the optical disk, and the other two are used as sub-beams for carrying out tracking servo of the optical pickup device. These three beams make three light spots on the optical disk. Namely, the tracking servo is performed by a so-called three beams method.

The reflection light from the optical disc is incident onto a polarization split element 204 after being reflected by a reflection surface 203 of the beam splitter 202. The polarization split element 204 is made of two optical crystals respectively having a crystal axis, which are orthogonal when they are joined. The polarization split element 204 splits the reflection light into two orthogonal polarization components. Then, the split reflection light from the optical disc is reflected by a reflection surface 205, and is incident onto the photoreceptor 207 after being partly diffracted by the first diffraction element 206.

When the tracking servo is performed by the described three beams method, it is necessary to adjust the positions of the sub-beams on the optical disc so as to obtain an accurate tracking signal. The positions are adjusted by rotating the main body 220 of the device about an optical axis 221 of the semiconductor laser 201.

However, the described arrangement of the conventional semiconductor laser package and the optical pickup device has difficulties in downsizing and cost reduction of the device.

In the semiconductor package disclosed in the Japanese Patent Publication No. 3035077, the semiconductor laser chip 104 is disposed in the center of the component bearing surface of the stem 101 and the photodiode 106 is disposed on one side of the semiconductor laser chip 104, which makes the other side of the semiconductor laser chip 104 empty. Therefore, as the free space takes the half of the stem, it results in the difficulties in downsizing and cost reduction of the device.

Also, in the semiconductor package disclosed in the Japanese Unexamined Patent Publication No. 2000-123433, the semiconductor laser chip 201 is disposed in the center of main body 202 and the photoreceptor 207 is disposed on one side of the semiconductor laser chip 201 and the other side of the semiconductor laser chip 201 is empty, thereby causing the difficulties in downsizing and cost reduction of the device.

Further, in this arrangement, polarization split element 204 is disposed between the reflection surfaces 203 and 205 of beam splitter 202, and it makes the size of the device large and therefore the free space also becomes larger.

SUMMARY OF THE INVENTION

The present invention is made in view of the foregoing conventional problems, and an object is to provide an optical semiconductor component package with no unused space, which realizes cost reduction and downsizing.

In order to solve the foregoing problems, a optical semiconductor package of the present invention including:

a stem, having a component bearing surface, which includes a light emitter and a photoreceptor on the component bearing surface. The stem has an outline made up of opposed first and second circular-arc parts, a first straight-line part which connects each end of the first and second circular-arc parts and a second straight-line part which connects each other end of the first and second circular-arc parts. The first and second circular-arc parts have a common center, and the first circular-arc part has a larger radius than that of the second circular-arc part.

In the foregoing arrangement, the outline of the component bearing surface of the stem is made up of the opposed first and second circular-arc parts which have a common center. This makes it possible to rotate the stem about the center by engaging both sides of the stem, which are curved along the first and second circular-arc parts, in each concave part of a housing.

Further, since the first circular-arc part has a larger radius than that of the second circular-arc part, the space between the first circular-arc part and the center is larger than the space between the second circular-arc part and the center. This makes it possible to efficiently use the whole space of the stem by using the larger space for disposing the photoreceptor. Further, the free space can be reduced as small as possible.

Additional objects, features, and strengths of the present invention will be made clear by the description below. Further, the advantages of the present invention will be evident from the following explanation in reference to the drawings.

DESCRIPTION OF THE EMBODIMENTS

[Embodiment 1]

Figure 1:
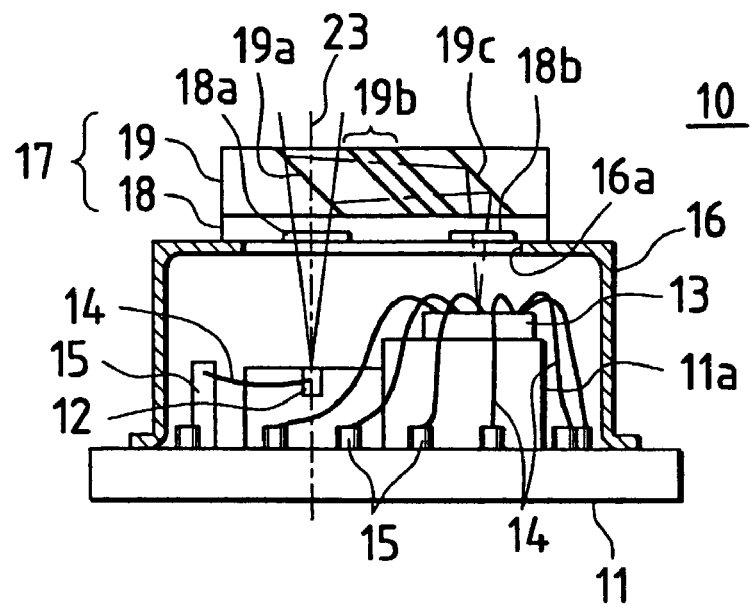
FIG. 1 is a vertical cross-sectional view showing an optical semiconductor component package according to a first embodiment of the present invention.
Figure 2:
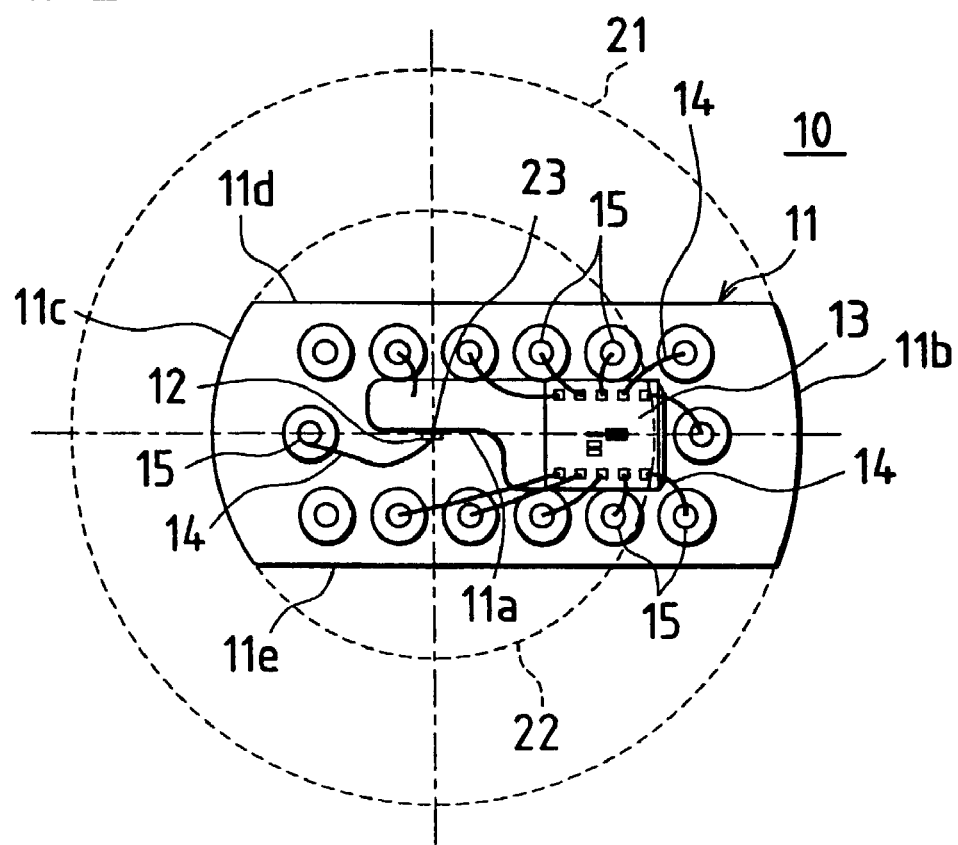
FIG. 2 is a plan view showing a stem of the optical semiconductor component package shown in FIG. 1.
Figure 3:
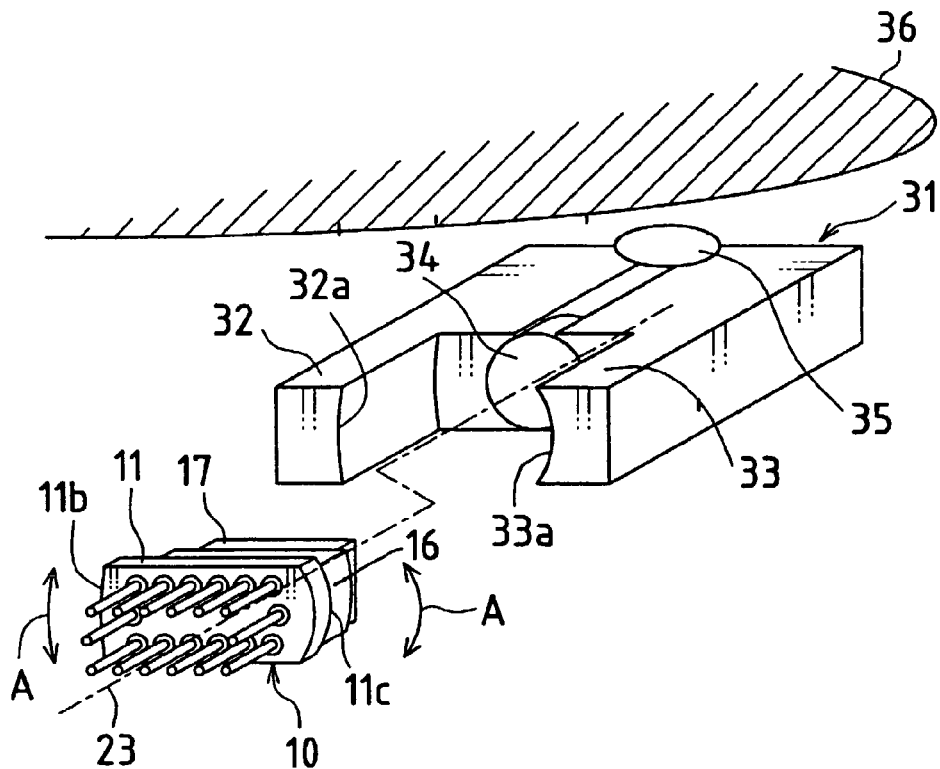
FIG. 3 is a perspective view schematically showing an optical pickup device to which the optical semiconductor component package of FIG. 1 is mounted.

The following will explain a first embodiment of the present invention with reference to FIGS. 1 through 3.

FIG. 1 is a vertical cross-sectional view showing an optical semiconductor component package according to a first embodiment of the present invention. Further, FIG. 2 is a plan view showing a stem of the package according to the present embodiment.

In a package 10 of the present embodiment, a bump is formed on the component bearing surface of the stem 11 to be a block 11a. A semiconductor laser 12 is affixed to the sidewall of the block 11a, and a light detector 13 is affixed on the top of the block 11a. The semiconductor laser 12 is connected to a lead terminal 15 via a wire 14. Also, photoreceptors of the light detector 13 are respectively connected to the lead terminals via wires 14.

Further, the component bearing surface of the stem 11 is covered with a cap 16, which has a compound optical element 17 on its laser beam emission window 16a. The compound optical element 17 is made up by laminating a quarts substrate 18 and a light split element 19. A first diffraction grating 18a and a second diffraction grating 18b are formed on the quarts substrate 18. The light split element 19 includes a first reflection surface 19a, polarization split element 19b and a second reflection surface 19c.

Here, the light beam emitted from the semiconductor 12 is incident onto the first diffraction grating 18a, and is divided into three by the first diffraction grating 18a, then is incident onto the optical disc via the light split element 19 and a lens (described later) of the optical pickup device. One of the three beams is used as a main-beam for reading out data from the optical disk and writing data on the optical disk, and the other two are used as sub-beams for carrying out tracking servo of the optical pickup device. These three beams make three light spots on the optical disk. Here, tracking servo is performed by a so-called three beams method.

The reflection light from the optical disc is incident onto the light split element 19. Then the light is reflected rightward in FIG. 1 by the first reflection surface 19a, and is incident onto the polarization split element 19b. Further, the light is divided into orthogonal polarization components by the polarization split element 19b and is reflected downward in FIG. 1 by the second reflection surface 19c, and then is incident onto the second diffraction grating 18b. The second diffraction grating 18b divides the polarization components of the reflection light into plural light beams and lead the plural light beams to be incident onto the light detector 13. These light beams can be an information reproducing light beam, a light beam for tracking servo, or a light beam for detecting addresses. Further, information is reproduced from the optical disc by differentially detecting the orthogonal polarization components.

Incidentally, as clearly shown in FIG. 2, the outline of the component bearing surface of the stem 11 is made up of first and second circular-arc parts 11b and 11c, which are opposed, and a first straight-line part 11d which connects respective ends of the first and second circular-arc parts 11b and 11c, and a second straight-line part 11e which connects respective other ends of the first and second circular-arc parts 11b and 11c. The first circular-arc part 11b is a part of a first virtual circle 21. Further, the second circular-arc part 11c is a part of a second virtual circle 22 whose radius is smaller than that of the first virtual circle 21. Furthermore, those virtual circles respectively formed by the first and second circular-arc parts 11b and 11c have a common center, and the center coincides the light axis 23 of the semiconductor laser 12.

Here, when the tracking servo is performed by the described three beams method, it is necessary to adjust the spotting positions of the sub-beams on the optical disc so as to obtain an accurate tracking signal. The positions are adjusted by rotating the package 10 about an optical axis 23 of the semiconductor laser 12.

For example, in the optical pickup device shown in FIG. 3, first and second guides 32 and 33 are provided on a housing 31. Further, a circular-arc concave part 32a whose radius is slightly larger than the first circular-arc part 11b is formed inside of the first guide 32, and a circular-arc concave part 33a whose radius is slightly larger than the second circular-arc part 11c is formed inside of the second guide 33. Then the stem 11 of the package 10 is engaged in the concave parts 32a and 33a of the first and second guides 32 and 33, and is held so that the stem 11 can rotate. Here, the light axis 23 of the semiconductor laser 12 and the light axis of the optical pickup device come to the same position. With this arrangement, it is possible to rotate the package 10 in a direction indicated by an allow A about the light axis without shifting the optical axis of the semiconductor laser 12 and the optical pickup device, since the canters of the first and second circular-arc parts 11b and 11c come to the same position of the light axis.

Note that, a light beam is emitted from the package 10 and is collected on an optical disc 36 via a collimator lens 34, a reflection mirror (not shown), and an objective lens 35. Then, the reflection light from the optical disc 36 go through those elements in reverse order, then is incident onto the package 10.

In the optical semiconductor component package 10 having the described arrangement, in the stem 11, the first circular-arc part 11b has a larger radius than that of the second circular-arc part 11c. Accordingly, the space between the first circular-arc part 11b and the center (the light axis 23 of the semiconductor laser 12) becomes larger, which makes the space between the second circular-arc part 11c and the center (the light axis 23 of the semiconductor laser 12) smaller. Therefore, the larger space can be used for disposing the light detector 13 and the polarization split element 19b, and also the free space can be reduced as small as possible. Consequently, the package 10 can be downsized and also the cost can be reduced.

[Embodiment 2]

Figure 4:
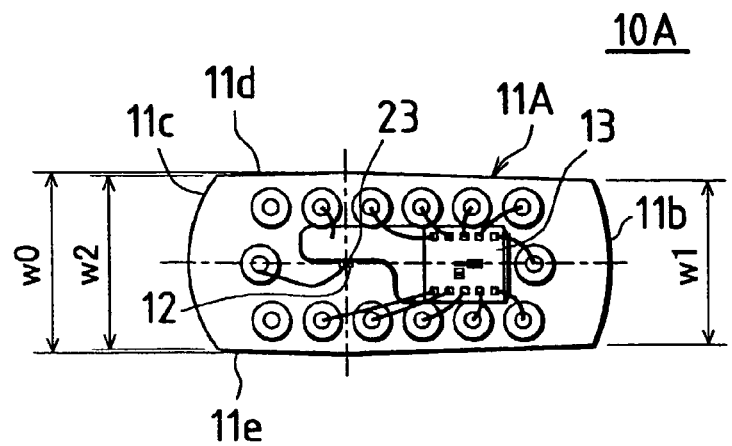
FIG. 4 is a plan view showing an optical semiconductor component package according to a second embodiment of the present invention.
Figure 5:
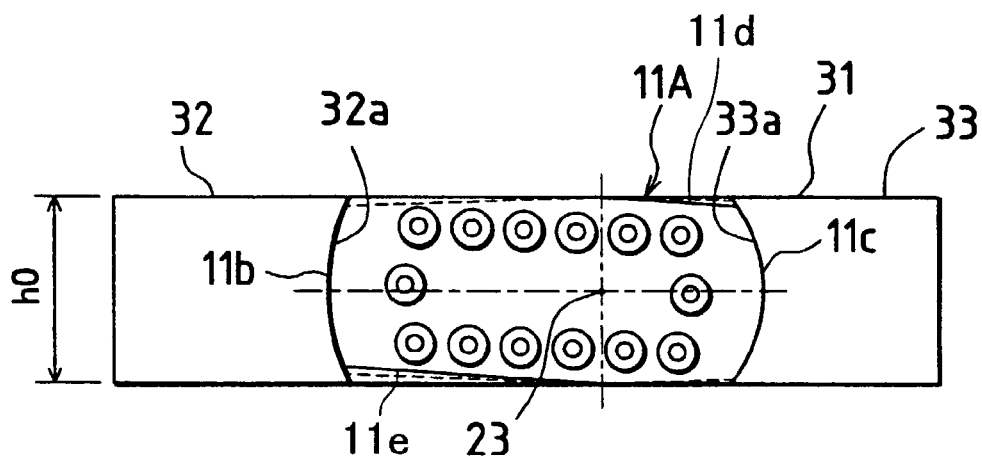
FIG. 5 is a plan view showing a housing of an optical pickup device to which the optical semiconductor component package of FIG. 4 is mounted.
Figure 6:
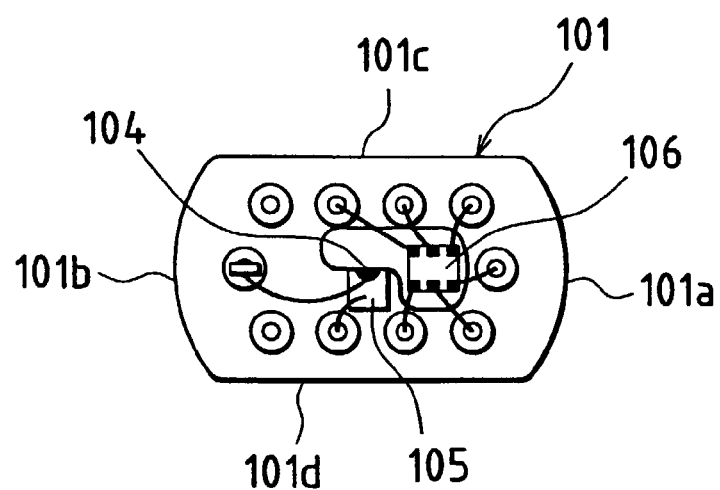
FIG. 6 is a plan view showing a conventional optical semiconductor component package.
Figure 7:
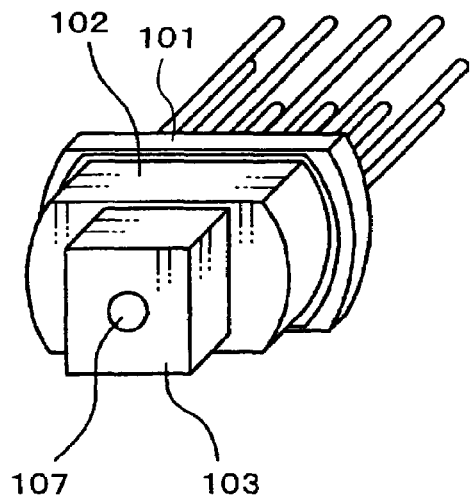
FIG. 7 is a perspective view showing the optical semiconductor component package of FIG. 6.
Figure 8:
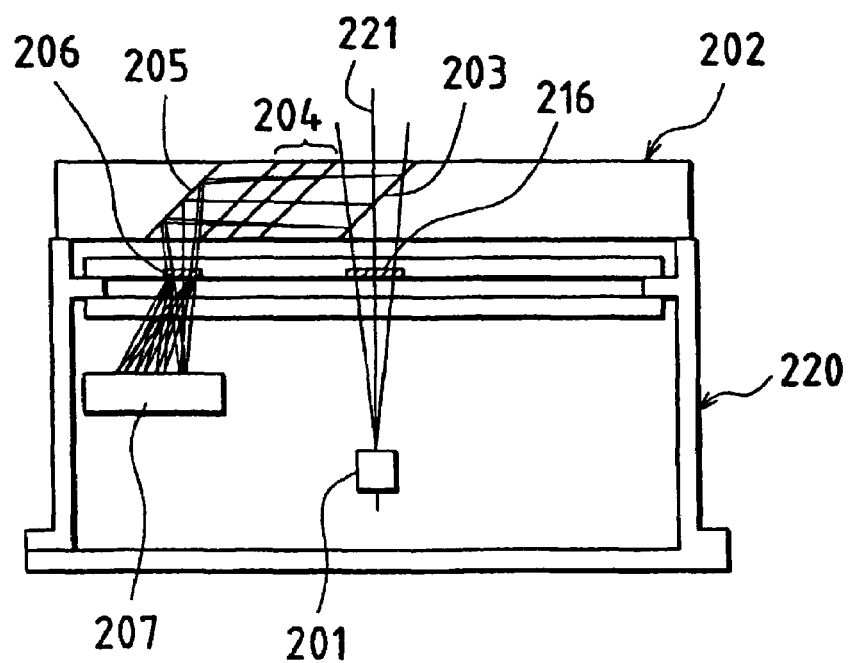
FIG. 8 is a cross-sectional view showing a conventional optical pickup device.

The following will explain another embodiment of the present invention with reference to FIG. 4 and FIG. 5. For ease of explanation, materials having the equivalent functions as those shown in the drawings pertaining to Embodiment 1 above will be given the same reference symbols, and explanation thereof will be omitted here.

FIG. 4 is a plan view showing an optical semiconductor component package according to a second embodiment of the present invention.

A package 10A of the present embodiment adopts a stem 11A, instead of the stem 11 included in the package 10 of FIG. 1. In the outline of the component bearing surface of the stem 11A, the distance between the first and second straight-line parts 11d and 11e becomes the widest on the position of light axis 23 of the semiconductor laser 12, and gradually becomes narrower as it gets closer to the circular-arc parts 11b and 11c. Namely, the following relationship is satisfied:

$$w1 < w2 < w0$$

where w0 representing the distance between the first and second straight-line parts 11d and 11e on the position of the light axis 23 of the semiconductor laser 12;

w1 representing the distance between both ends of the first circular-arc part 11b; and w2 representing the distance between both ends of the second circular-arc part 11c.

FIG. 5 shows the state where the stem 11A is engaged in the concave parts 32a and 33a inside of the housing 31 of the optical pickup device. Here, the thickness h0 of the housing 31 is equal to the distance w0 between the first and second straight-line parts 11d and 11e (h0=w0). Accordingly, the distance w1 between both ends of the first circular-arc part 11b, and the distance w2 between both ends of the second circular-arc part 11c, are smaller than the thickness h0 of the housing 31.

Therefore, even when the first and second circular-arc parts 11b and 11c are slightly shifted due to the adjustment by rotating the package 10A, the first and second circular-arc parts 11b and 11c will not go outside of the housing 31. This makes it possible to determine the thickness of the housing 31 to the minimum value, as there is no necessity to have extra thickness.

Note that, the present invention is not limited to those embodiments above, and the same may be varied in many ways. For example, the following relationship may be satisfied:

$$w1 < w2 \approx w0$$

where w0 representing the distance between the first and second straight-line parts 11d and 11e on the position of light axis 23 of the semiconductor laser 12;

w1 representing the distance between both ends of the first circular-arc part 11b; and w2 representing the distance between both ends of the second circular-arc part 11c.

This is because, since the second circular-arc part 11c has a small radius, the adjustment by rotating the package 10A causes only a slight movement of each end of the second circular-arc part, and the first and second circular-arc parts 11b and 11c will not go outside of the housing 31. Further, the present invention can suitably adopt other types of optical element, or can have different arrangements.

As described, according to the present invention, the outline of the component bearing surface of the stem is made up of the opposed first and second circular-arc parts which have a common center. This makes it possible to rotate the stem about the center by engaging both sides of the stem, which are curved along the first and second circular-arc parts, in each concave part of a housing. Further, since the first circular-arc part has a larger radius than that of the second circular-arc part, the space between the first circular-arc part and the center is larger than the space between the second circular-arc part and the center. This makes it possible to efficiently use the whole space of the stem by using the larger space for disposing the photoreceptor. Further, the free space can be reduced as small as possible, thereby realizing downsizing and cost reduction of the package.

Further, in the present invention, it may be arranged such that the center of the first and second circular-arc parts is positioned on a light axis of the light emitter.

With the foregoing arrangement, the light axis of the light emitter stays on the same position when the stem is rotated about the center by engaging both sides of the stem, which are curved along the first and second circular-arc parts, in each concave part of a housing. Thus, the adjustments by rotating the stem can be performed easily.

Further, in the present invention, it may be arranged such that w1<w2<w0 is satisfied, where:
w0 representing a distance between the first and second straight-line parts in a vicinity of the center of the first and second circular-arc parts;
w1 representing a distance between both ends of the first circular-arc part; and
w2 representing a distance between both ends of the second circular-arc part.

With the foregoing arrangement, the distance w1 between both ends of the first circular-arc part, and the distance w2 between both ends of the second circular-arc part, are smaller than the distance w0 between the first and second straight-line parts in the vicinity of the center of the first and second circular-arc parts. Therefore, even when the both sides of the first and second circular-arc parts are slightly shifted due to the adjustment by rotating the package, the both sides of the first and second circular-arc parts will not go outside of the width between the first and second straight-line parts in the vicinity of the center of the first and second circular-arc parts. This makes it possible to determine the space for providing the stem as small as possible.

The embodiments and concrete examples of implementation discussed in the foregoing detailed explanation serve solely to illustrate the technical details of the present invention, which should not be narrowly interpreted within the limits of such embodiments and concrete examples, but rather may be applied in many variations within the spirit of the present invention, provided such variations do not exceed the scope of the patent claims set forth below.

What is claimed is:

1. An optical semiconductor component package, comprising:
    a stem, having a component bearing surface, which includes a light emitter and a photoreceptor on the component bearing surface, the stem having an outline made up of (a) opposed first and second circular-arc parts, (b) a first straight-line part which connects each end of the first and second circular-arc parts and (c) a second straight-line part which connects each other end of the first and second circular-arc parts,
    wherein:
        the first and second circular-arc parts have a common center, and the first circular-arc part has a larger radius than that of the second circular-arc part.

2. The optical semiconductor component package as set forth in claim 1, wherein:
    the center of the first and second circular-arc parts is positioned on a light axis of the light emitter.

3. The optical semiconductor component package as set forth in claim 1 wherein w1<w2<w0 is satisfied,
where:
    w0 representing a distance between the first and second straight-line parts in a vicinity of the center of the first and second circular-arc parts;
    w1 representing a distance between both ends of the first circular-arc part; and
    w2 representing a distance between both ends of the second circular-arc part.

4. The optical semiconductor component package as set forth in claim 1 wherein w1<w2≈w0 is satisfied:
where:
    w0 representing the distance between the first and second straight-line parts in the vicinity of the center of the first and second circular-arc parts;
    w1 representing the distance between both ends of the first circular-arc part; and
    w2 representing the distance between both ends of the second circular-arc part.

5. An optical pickup device comprising an optical semiconductor component package,
    the optical semiconductor component package including:
        a stem, having a component bearing surface, which includes a light emitter and a photoreceptor on the component bearing surface, the stem having an outline made up of (a) opposed first and second circular-arc parts, (b) a first straight-line part which connects each end of the first and second circular-arc parts and (c) a second straight-line part which connects each other end of the first and second circular-arc parts,
    wherein:
        the first and second circular-arc parts have a common center, and the first circular-arc part has a larger radius than that of the second circular-arc part.

6. An optical semiconductor component package, comprising:
    a light emitter;
    a photoreceptor; and
    a stem, having a component bearing surface, which has the light emitter and the photoreceptor, the component bearing surface of the stem being rotated about a light axis of the light emitter so as to carry out adjustments,
    wherein:
        the stem is made up of (a) opposed first and second circular-arc parts having different radiuses, (b) a first straight-line part which connects each end of the first and second circular-arc parts and (c) a second straight-line part which connects each other end of the first and second circular-arc parts, the first and second circular-arc parts having a center coinciding with the center of the rotation, and the photoreceptor being provided on a side of the first circular-arc part whose radius is larger than that of the second circular-arc part.

7. The optical semiconductor component package as set forth in claim 6, wherein:
    the first straight-line part and the second straight-line part are substantially parallel, and the stem has a substantially ellipse shape.

8. The optical semiconductor component package as set forth in claim 7, wherein:
    the photoreceptor is provided in a direction parallel to the first and second straight-line parts so that the light emitter and the photoreceptor are collaterally provided.

9. An optical pickup device comprising an optical semiconductor component package,
    the optical semiconductor component package including:
        a light emitter;
        a photoreceptor; and
        a stem, having a component bearing surface, which has the light emitter and the photoreceptor, the component bearing surface of the stem being rotated about a light axis of the light emitter so as to carry out adjustments, wherein:
the stem is made up of (a) opposed first and second circular-arc parts having different radiuses, (b) a first straight-line part which connects each end of the first and second circular-arc parts and (c) a second straight-line part which connects each other end of the first and second circular-arc parts, the first and second circular-arc parts having a center coinciding with the center of the rotation, and the photoreceptor being provided on a side of the first circular-arc part whose radius is larger than that of the second circular-arc part.

* * * * *